United States Patent
Sheridan et al.

(10) Patent No.: US 6,489,229 B1
(45) Date of Patent: Dec. 3, 2002

(54) METHOD OF FORMING A SEMICONDUCTOR DEVICE HAVING CONDUCTIVE BUMPS WITHOUT USING GOLD

(75) Inventors: Devin Robert Sheridan, Round Rock, TX (US); Larry J. Larsen, Bastrop, TX (US); Martie D. Knauss, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/949,454

(22) Filed: Sep. 7, 2001

(51) Int. Cl.$^7$ ............................................. H01L 21/44
(52) U.S. Cl. .................... 438/614; 438/613; 438/615; 438/654
(58) Field of Search ................................ 438/612, 613, 438/614, 615, 654

(56) References Cited

U.S. PATENT DOCUMENTS

| | | | |
|---|---|---|---|
| 3,458,925 A | 8/1969 | Napier et al. .................. 29/578 |
| 4,434,434 A | 2/1984 | Bhattacharya et al. ........ 357/71 |
| 4,516,525 A | 5/1985 | Bourgeois et al. .......... 118/688 |
| 4,622,205 A | 11/1986 | Fouts et al. .................. 420/566 |
| 4,646,958 A | 3/1987 | Howard, Jr. .................. 228/123 |
| 5,137,845 A | 8/1992 | Lochon et al. .............. 437/183 |
| 5,470,787 A | 11/1995 | Greer .......................... 437/183 |
| 6,107,180 A | 8/2000 | Munroe et al. ............. 438/613 |
| 6,184,061 B1 * | 2/2001 | Wu et al. ................... 438/106 |
| 6,417,089 B1 * | 7/2002 | Kim et al. .................. 438/612 |

OTHER PUBLICATIONS

Greer, "An Extended Eutectic Solder Bump for FCOB," IEEE, 1996 Electronic Components and Technology Conference, pp. 546–551.

Pan et al., "Microstructures of Phased–in Cr–Cu/Cu/Au Bump–limiting Metallization and its Soldering Behavior With High Pb Content and Eutectic PbSn Solders," American Institute of Physics, Appl. Phys. Lett. 71 (20), Nov. 17, 1997, pp. 2946–2948.

Liu et al., "High Sn Solder Reaction with Cu Metallization," Scripta Materialia, vol. 35, No 1, pp. 65–69 (1996).

* cited by examiner

Primary Examiner—Trung Dang
(74) Attorney, Agent, or Firm—Robert L. King; Patricia S. Goddard

(57) ABSTRACT

A semiconductor device (10) includes a solder bump (40) that is formed using a gold-free under-bump metallurgy (UBM) (21). In a preferred embodiment, UBM (21) includes a diffusion barrier layer (22) of chromium and a metallic layer (24) of copper. The bump layer metallurgy (31) is deposited directly on the metallic layer, without an intervening gold layer. To overcome problems associated with a native oxide layer (26) which forms on the metallic layer, especially on copper, the bump metallurgy includes a seed layer (32) of tin that is deposited prior to a bulk lead layer (34). The bump metallurgy includes a final metallic layer (36) having sufficient tin to make a bump having approximately 97% Pb and 3% tin.

17 Claims, 2 Drawing Sheets

METHOD OF FORMING A SEMICONDUCTOR DEVICE HAVING CONDUCTIVE BUMPS WITHOUT USING GOLD

FIELD OF THE INVENTION

This invention relates in general to semiconductor devices and their method of formation, and more particularly to semiconductor devices having solder bumps and methods for forming the solder bumps.

Background of the Invention Controlled Collapse Chip Connection (C4) interconnect technology is one form of flip-chip bump technology which is an alternative to wire bonding. The C4 interconnect process involves forming solder bumps and under-bump metallurgy (UBM) structures on a semiconductor chip's bond pads. The solder bumps are used in place of wires to electrically connect the chip's circuitry to external sources, for example to substrates used for chip packaging. The UBM provides important functions with respect to the C4 structure, among them include providing adhesion, electric continuity, and barrier protection between the C4 solder bump and semiconductor chip.

Conventional high-lead C4 solder bumps (solder bumps containing 97% lead and 3% tin) use a UBM integration that consists of sequentially forming a chromium, chromium-copper, copper, and gold layers over the bond pad and then forming the C4 Lead-Tin solder bump on the gold layer. Subsequent heat processes are then used to reflow and form the C4 bump structure, wherein the gold layer provides oxidation protection of the underlying copper layer; the copper layer functions as the primary wetting surface for the C4 bump; the chromium-copper layer promotes intermetal adhesion by functioning as a nucleating layer onto which copper and tin intermetallics ($Cu_3Sn$) form during subsequent reflow processes; and the chromium layer functions as barrier and an adhesion promoter to the underlying semiconductor chip surface.

One problem with conventional high-lead solder bumps is manufacturing cost. High vacuum evaporators are expensive to purchase, operate, and maintain. Raw materials used in the process are expensive. While process parameters can be modified to improve throughput (e.g. operating at higher pressures) to reduce overall costs, there is always a need to reduce costs further. One of the highest variable cost of the conventional C4 process is the gold evaporation process, particularly costs associated with the gold source itself. Therefore, it would be desirable if a bump process were developed which could eliminate the need for utilizing gold.

DETAILED DESCRIPTION OF A PREFERRED EMBODIMENT

The present invention provides a method for eliminating the gold layer that is traditionally formed on top of a copper layer in a UBM stack. Gold has been used for over 30 years in evaporative solder bump processes for the purpose of preventing oxidation of the underlying copper layer. Copper, upon exposure to ambient air, forms a native oxide layer which impairs adhesion of the bump to the UBM and, because it is a dielectric, also results in poor electrical characteristics of the bumps. The present invention provides a method in which gold can be eliminated and problems associated with copper oxidation can be overcome. Although the discussion herein specifies solder bumps, other conductive materials besides solder may be utilized. In one form, after the copper layer of the UBM is deposited, the semiconductor substrate is exposed to ambient air as a consequence of moving from one processing tool to another in which a vacuum environment cannot be maintained. As a result, a copper oxide layer is formed. A bump metallurgy is deposited onto the copper oxide layer; however, adhesion and electrical performance is not impaired due to the particular bump stack metallurgy used. More specifically, in a preferred embodiment of the invention, the bump metallurgy for the solder bump is a sequence of depositing a tin layer prior to depositing a lead layer. In a preferred embodiment, a second tin layer is deposited on the lead layer to improve uniformity of the solder bump composition and the ability to attach the bumped device to a substrate, and to allow probing of the device prior to reflow. The presence of the bottom tin layer helps overcome the problems associated with the native copper oxide. More specifically, the bottom tin layer readily interacts with the underlying copper/copper-oxide layers to form a copper-tin ($Cu_3Sn$) intermetallic that is sufficiently conductive and strong.

Figure 1:
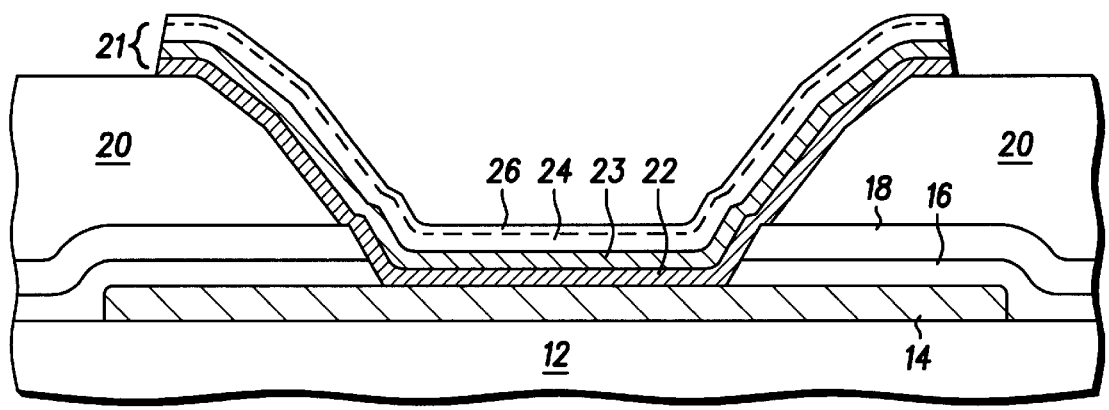
FIG. 1 illustrates, in cross-section, an enlarged view of a portion of a semiconductor device having under-bump metallurgy (UBM) formed in accordance with the present invention.

FIG. 1 illustrates, in cross-section, an enlarged portion of a semiconductor device solder bump 10 in accordance with one embodiment of the present invention. Semiconductor device solder bump 10 includes a substrate 12 upon which a solder bump will ultimately be formed. Substrate 12 includes all the active and/or passive circuitry of the device, which is generally made up of various conductive and dielectric layers, doped regions, contacts, etc. formed on a semiconductor substrate. The methods for forming the circuitry of the device are well known in the art and are not important for purposes of understanding the present invention. Accordingly, the detail of substrate 12 is not shown in FIG. 1 and will not be discussed further.

A conductive layer, preferably a metal layer, of for example copper or aluminum, is deposited on substrate 12 and patterned to form conductors or metal pads that are electrically connected to the underlying circuitry within substrate 12. One such conductor or metal pad 14 is shown in FIG. 1, although one skilled in the art will understand that hundreds of these pads can be formed on any one semiconductor device. After forming the metal pads, one or more passivation layers are deposited to protect the circuitry of the device. As illustrated, two such passivation layers are shown, a first passivation layer 16 preferably a silicon-oxynitride material formed by chemical vapor deposition (CVD) and a second passivation layer 18 preferably a silicon nitride material also formed by CVD. A stress compensation layer 20, preferably a polyimide layer, is deposited over the passivation layers. The stress compensation layer 20 and passivation layers 16 and 18 are then patterned and etched to form a via or opening therein which exposes a portion of underlying metal pad 14. Alternatively, the passivation and stress compensation layers could be patterned independently. The deposition and etch techniques used to form the passivation layers and stress compensation layer are well known and therefore will not be discussed in detail.

Furthermore, the present invention is not limited to using any particular passivation or stress compensation layers.

After exposing metal pad 14, an under-bump metallurgy (UBM) 21 is deposited over the device. In general, UBM 21 includes a diffusion barrier layer 22 and a metallic layer 24. Metallic layer 24 overlies and is in direct contact with diffusion barrier layer 22. Metallic layer 24 is devoid of any gold content. The diffusion barrier layer 22 serves to prevent contaminants from diffusing into underlying circuitry, but also serves as an adhesion layer for adhering the overall bump structure to stress compensation layer 20. The metallic layer 24 serves as the source for forming an intermetallic composition with the bump metallurgy. In accordance with a preferred embodiment of the present invention, diffusion barrier layer 22 is a layer of chromium, and metallic layer 24 is a layer of copper. In this embodiment, the inclusion of an intervening phase layer 23 formed of a co-deposited copper-chromium layer is advantageous to improve the adhesion between the chromium and copper. The chromium and copper are preferably deposited by an evaporative deposition process using a bump mask (not shown) in accordance with known techniques. The intervening phase layer is formed in the same process sequence in accordance as is known in the art. Alternatively, sputter deposition processes could be used. In place of chromium, other suitable materials for diffusion barrier layer 22 include materials in the group of titanium, tungsten, or other refractory metals and alloys thereof. In place of copper, metallic layer 24 may be implemented with nickel (Ni). Other bi-metallic materials that intervening phase layer 23 may be made of include a phase layer having two metals selected from the group of Cr, Ti, W, Cu and Ni.

In contrast to prior art processes, UBM 21 has no additional oxidation barrier layer formed on second metallic layer 24. Traditionally, a gold layer has been deposited on the copper layer, while still under vacuum in the evaporation chamber, to prevent oxidation of copper. The presence of a copper oxide layer is undesirable in that it increases the resistivity of the bump and decreases the strength of the bump. Accordingly, the industry has a widely accepted practice of capping the copper layer with an oxidation barrier layer such as gold. However, as noted previously, gold is an extremely costly component of the overall bump formation process. The present invention permits the elimination of the oxidation barrier layer, resulting in greatly reduced manufacturing costs, while maintaining adequate bump strength and electrical characteristics.

After depositing the metallic layer 24, semiconductor device solder bump 10 is permitted to be exposed to an ambient air environment such that a native oxide layer 26 is permitted to form on an exposed surface of metallic layer 24. With copper as the metallic layer 24, a native oxide readily forms, generally having a thickness of about 50–100 Angstroms. The native oxide layer 26 is undesired and is a natural result once the first vacuum environment has been removed. Not maintaining a continuous vacuum environment during the entire process is advantageous because many of the processing steps would become much more expensive to implement, or impractical, if a continuous vacuum were required.

Figure 2:
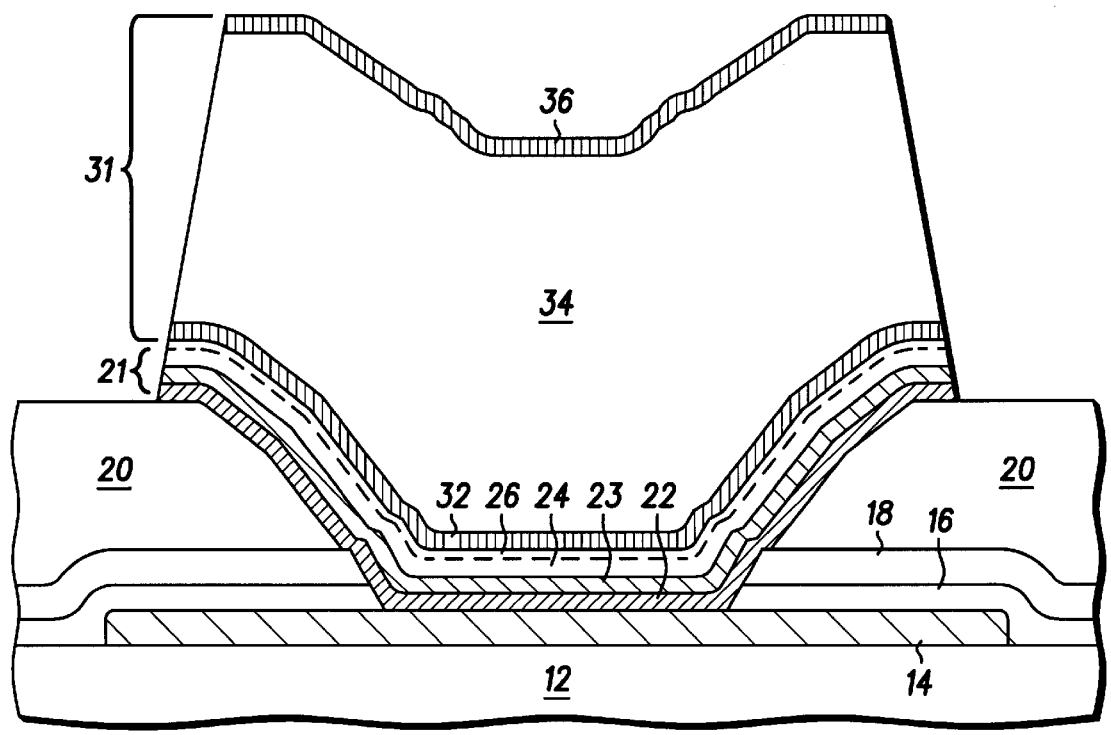
FIG. 2 illustrates, in cross-section, the semiconductor device of FIG. 1 having a bump stack formed on the UBM in accordance with the present invention.

As illustrated in FIG. 2, a bump stack 31 is then deposited on the UBM 21. Generally, the bump stack includes a seed layer 32, a conductive bump in the form of bulk lead layer 34, and another metallic layer in the form of capping layer 36. The bulk lead layer 34 is in direct contact with seed layer 32. In a preferred embodiment, the seed layer 32 is comprised of a predetermined metal in the form of tin, (Sn), as is the capping layer 36. Capping layer 36 may also be implemented with other metals. In this embodiment, the bump stack layers are preferably deposited sequentially in a single evaporator under a second vacuum environment and without breaking the vacuum.

Seed layer 32 is deposited immediately overlying or adjacent to the native oxide layer 26. The thickness of seed layer 32 is chosen to be sufficient to create an intermetallic composition with underlying metallic layer 24 without requiring a reflow operation. As a particular example, a tin seed layer will form an intermetallic composition ($Cu_3Sn$) with an underlying copper layer as part of UBM 21. The intermetallic forms even with the intervening native oxide that is formed on the copper metallic layer 24 prior to deposition of the bump stack. Generally, the thickness of the seed layer is expected to be in a range substantially between 500 to 2,500 Angstroms. The deposition thickness of the seed layer 32 can be controlled by deposition rate monitors of the equipment or by other suitable controls which are a part of the evaporation equipment.

After depositing seed layer 32, a bulk lead layer 34 is deposited overlying seed layer 32. The lead layer 34 preferably has a thickness in a range of substantially 100 to 150 microns. This relatively thick lead layer 34, as compared to seed layer 32, forms the bulk component of the solder bump. Then a capping layer 36 is deposited overlying the lead layer 34. The capping layer 36 is preferably another layer of tin and has a thickness in a range of substantially 4.5 to 8 microns. Capping layer 36 serves to provide the bulk of the tin used to form a final bump composition of 97% lead, 3% tin, and capping layer 36 enables the device to be probed prior to bump reflow as discussed below.

At this point, semiconductor device solder bump 10 can be electrically tested or probed prior to a bump reflow operation by making direct contact to the capping layer 36. Capping layer 36 is used as an electrical contact to the semiconductor device solder bump 10 for probe testing. Probing the device at this stage has been shown to improve probe yield, extend probe card lifetime, and improve probe throughput. By probing on the capping layer 36, i.e. prior to reflow, lead doesn't build up on the probe tips, thereby saving probe cleaning time and preventing lead particulates from lowering yields.

Figure 3:
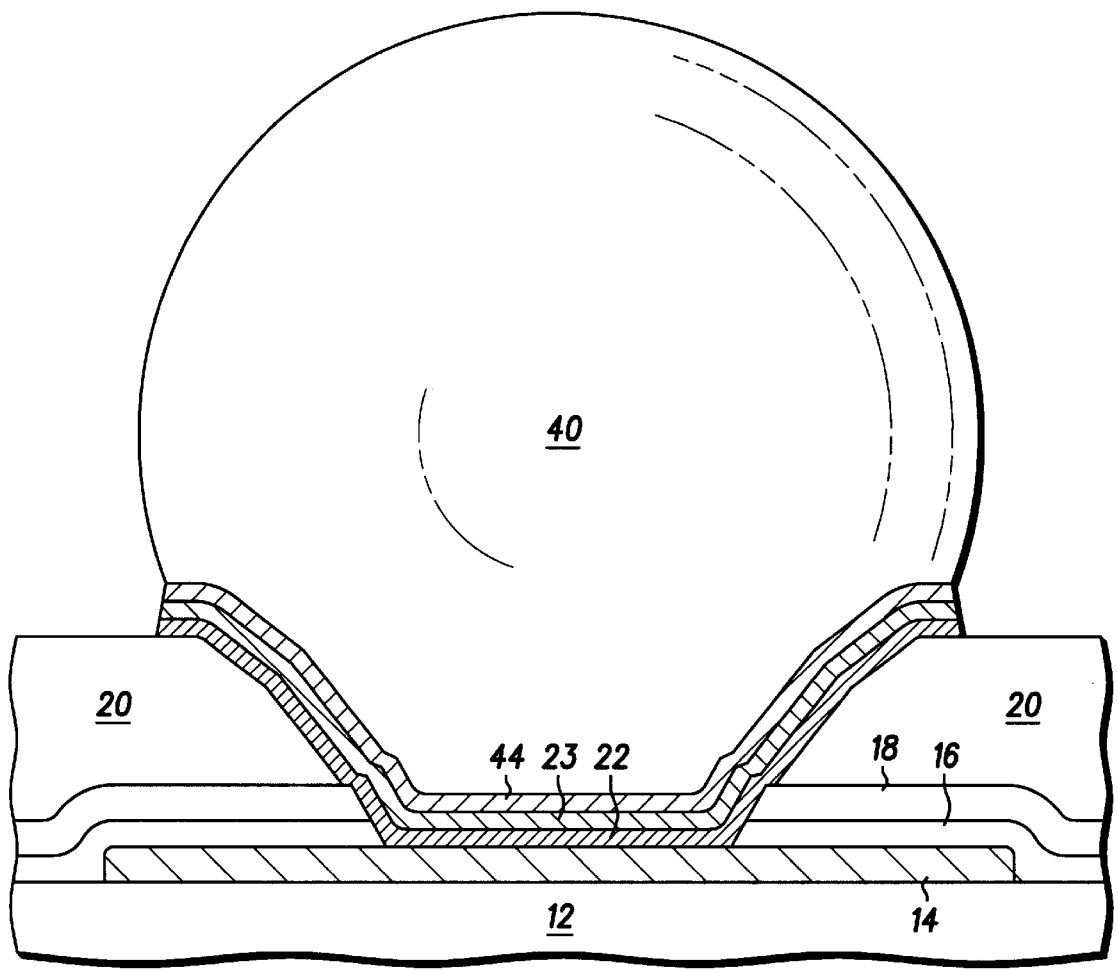
FIG. 3 illustrates, in cross-section, the semiconductor device of FIG. 2 following a reflow operation of the solder bump.

After probing, the device is subjected to a conventional "high temperature" bump reflow operation (e.g. at an elevated temperature in a range of approximately 350–400° C. for a time sufficient to compositionally blend the lead and tin layers and displace the native oxide layer 26). The resulting structure is a substantially spherical structure as illustrated in FIG. 3. As illustrated, semiconductor device solder bump 10 includes a final conductive bump in the form of solder bump 40 that, in a preferred form, has a composition of approximately 97% lead, 3% tin. Beneath solder bump 40, the seed layer 32 and metallic layer 24 have reacted to form an intermetallic layer 44 at the bump-UBM interface that has displaced the native oxide layer 26. In a preferred embodiment, the intermetallic will be a copper-tin intermetallic ($Cu_3Sn$). However, it should be noted that the full thickness of intermetallic layer 44 may not actually be an intermetallic composition. The upper most region of the intermetallic layer 44 near the bump may be an intermetallic composition, whereas the bottom most region may remain as the original metallic composition of metallic layer 24. For example, the upper most region may be $Cu_3Sn$, but it may be copper alone at the bottom of layer 44. Diffusion barrier layer 22 and chromium-copper layer 23 remain substantially intact after the reflow operation as illustrated without substantial mixing.

Experiments have shown that forming the bump stack with a seed layer directly on the native oxide layer produces a bump structure with sufficient electrical characteristics to meet electrical specifications for very high speed (i.e. 1 GHz and above) applications. Utilizing copper as the metallic layer 24 (with 50–100 angstroms of native oxide formed thereon) and tin as the seed layer, an adequate $Cu_3Sn$ intermetallic was formed using a tin seed layer thickness of substantially 500–2500 Angstroms. The resulting bumps had an acceptable resistance in a range of substantially 7–25 milliohms, and a pull strength in a range of substantially 17–35 grams per bump post-reflow. Prior to reflow, the bump strength was not measured, but is sufficient to withstand all normal processing conditions through the reflow operation, including probe.

The foregoing description and illustrations contained herein demonstrate many of the advantages associated with the present invention. By eliminating conventional oxidation barrier layers, such as gold, raw material costs are reduced, as are costs associated with gold deposition processing steps (e.g. associated ceramic costs, extra tool utilization time, etc). Apart from cost savings, it has been found that eliminating gold also reduces void formation in the final bump structure. Voids are known to form near the bump/UBM interface, and it is found that when gold is eliminated the extent of voiding is reduced. Additionally, it is known that gold embrittles the copper-tin ($Cu_3Sn$) intermetallic, so that elimination of gold improves the strength of the final bump structure.

Thus it is apparent that there has been provided, in accordance with the invention, a semiconductor device having an as-deposited solder bump structure and a method for making and using the same that fully meet the needs and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the present invention is not specifically limited to forming solder bumps using evaporation techniques. Sputtering techniques can be used, and the principles of the invention can also extend to plating of bumps. Furthermore, the invention is not specifically limited to use in conjunction for forming lead bumps. Gold is used in conjunction with many bump processes that could likewise benefit from its elimination. Therefore, it is intended that this invention encompass all such variations and modifications falling with the scope of the appended claims.

What is claimed is:

1. A method of forming a semiconductor device conductive bump comprising:

providing a substrate;

forming a conductor overlying the substrate;

forming a diffusion barrier layer overlying and adjoining the conductor;

forming a first metallic layer overlying and in direct contact with the diffusion barrier layer, the first metallic layer being devoid of any gold content, wherein an oxidation layer naturally forms on the first metallic layer upon exposure to ambient air;

forming a seed layer of a predetermined metal overlying and on the oxidation layer wherein the seed layer is electrically coupled to the first metallic layer;

forming a conductive bump overlying and in direct contact with the seed layer, wherein the semiconductor device conductive bump has no gold content; and reflowing the conductive bump at an elevated temperature to sufficiently displace the oxidation layer with an intermetallic of the seed layer and the first metallic layer to enhance adhesion of the conductive bump to the conductor.

2. The method of claim 1 further comprising:

a second metallic layer overlying the conductive bump, the second metallic layer also being void of any gold content, and being used as an electrical contact to the semiconductor device conductive bump for probe testing.

3. The method of claim 2 further comprising:

using any metal selected from a group consisting of chromium (Cr), titanium (Ti) and tungsten (W) as the diffusion barrier layer;

providing a phase layer having two metals, selected from a group consisting of the Cr, Ti, W, copper (Cu) and nickel (Ni), that are co-deposited between the diffusion barrier layer and the first metallic layer;

using copper (Cu) or nickel (Ni) as the first metallic layer; and using tin (Sn) as the second metallic layer.

4. The method of claim 1 further comprising:

reflowing the conductive bump at a temperature substantially in a range of 350 degrees Centigrade to 400 degrees Centigrade to form a substantially spherical structure.

5. The method of claim 1 further comprising:

sizing the seed layer to have a thickness approximately in a range of five hundred to two thousand five hundred Angstroms.

6. The method of claim 1 further comprising:

forming a vacuum environment to form the diffusion barrier layer and the first metallic layer; and removing the vacuum environment that results in the oxidation layer forming.

7. A method of forming a semiconductor device conductive bump comprising:

providing a substrate;

forming a conductor overlying the substrate;

forming a barrier layer overlying and adjoining the conductor;

forming a first metallic layer overlying and adjoining the barrier layer, the first metallic layer having no gold content;

allowing an oxide to form on an exposed surface of the first metallic layer;

forming in a first vacuum environment a second metallic layer overlying and adjoining the oxide;

forming in the first vacuum environment a conductive bump overlying the second metallic layer; and reflowing the conductive bump at a temperature within a range of substantially 350 degrees Centigrade to 400 degrees Centigrade to form the semiconductor device conductive bump, the semiconductor device conductive bump having no gold content.

8. The method of claim 7 further comprising:

forming in the first vacuum environment a third metallic layer overlying the conductive bump.

9. The method of claim 8 further comprising:

probing to test the semiconductor device conductive bump prior to reflowing the conductive bump by making direct contact to the third metallic layer.

10. The method of claim 7 further comprising:

forming the barrier layer and the first metallic layer in a second vacuum environment; and removing the second vacuum environment prior to allowing an oxide to form on the exposed surface of the first metallic layer.

11. The method of claim 10 further comprising:

forming the barrier layer, the first metallic layer and the second metallic layer by deposition.

12. The method of claim 7 further comprising:

forming the barrier layer and the first metallic layer by plating.

13. The method of claim 7 further comprising:

using chromium as the barrier layer;

using a combination of chromium and copper as the first metallic layer; and using either copper or tin as the second metallic layer.

14. A method for forming a conductive bump for use in a semiconductor device, comprising:

providing a substrate;

forming a metal pad overlying the substrate;

forming a chromium diffusion barrier layer overlying and in contact with the metal pad;

forming a phase layer having copper and chromium that are co-deposited onto the chromium diffusion barrier layer;

forming a copper layer overlying and in contact with the phase layer, wherein an undesired oxidation layer forms on the copper layer upon exposure to ambient air;

forming a tin seed layer overlying and in contact with the oxidation layer, the tin seed layer enhancing electrical continuity to the conductive metal pad;

forming a conductive bump overlying and in contact with the tin seed layer;

forming a tin layer overlying the conductive bump for permitting enhanced electrical contact to the conductive bump;

probing the conductive bump for test purposes by making contact to the tin layer; and reflowing the conductive bump at a temperature substantially in a range of 350 degrees Centigrade to 400 degrees Centigrade, the reflowing sufficiently displacing the undesired oxidation layer with an intermetallic of the tin seed layer and the copper layer to enhance adhesion of the conductive bump to the metal pad.

15. The method of claim 14 further comprising:

forming the chromium diffusion barrier layer, the phase layer, and the copper layer by a deposition process.

16. The method of claim 14 further comprising:

using two separate vacuum environments during the method, the undesired oxidation layer being formed between use of the two separate vacuum environments.

17. The method of claim 14 further comprising the steps of:

sizing the tin seed layer to have a thickness approximately in a range of five hundred to two thousand five hundred Angstroms.

* * * * *